(12) United States Patent
Hafen et al.

(10) Patent No.: US 11,999,547 B2
(45) Date of Patent: Jun. 4, 2024

(54) SYSTEMS AND APPARATUSES FOR AN INTERACTIVE MEDIA PACKAGE

(71) Applicant: MEDIA FAST, LC, American Fork, UT (US)

(72) Inventors: Amy Hafen, American Fork, UT (US); William Diaz, American Fork, UT (US)

(73) Assignee: MEDIA FAST, LC, American Fork, UT (US)

(*) Notice: Subject to any disclaimer, the term of this patent is extended or adjusted under 35 U.S.C. 154(b) by 821 days.

(21) Appl. No.: 17/085,709

(22) Filed: Oct. 30, 2020

(65) Prior Publication Data
US 2021/0130062 A1    May 6, 2021

Related U.S. Application Data

(60) Provisional application No. 62/928,224, filed on Oct. 30, 2019.

(51) Int. Cl.
| | | |
|---|---|---|
| B65D 75/54 | (2006.01) | |
| A45C 13/00 | (2006.01) | |
| B65B 5/02 | (2006.01) | |
| B65B 25/00 | (2006.01) | |
| B65D 75/14 | (2006.01) | |
| B65D 75/52 | (2006.01) | |
| B65D 85/30 | (2006.01) | |
| G06F 1/16 | (2006.01) | |
| H02J 7/00 | (2006.01) | |

(Continued)

(52) U.S. Cl.
CPC .............. *B65D 75/54* (2013.01); *B65B 5/024* (2013.01); *B65B 25/002* (2013.01); *B65D 75/14* (2013.01); *B65D 75/522* (2013.01); *B65D 85/30* (2013.01); *G06F 1/1616* (2013.01); *H02J 7/0045* (2013.01); *A45C 13/002* (2013.01); *H05K 5/0017* (2013.01); *H05K 5/0086* (2013.01); *H05K 5/0247* (2013.01)

(58) Field of Classification Search
CPC ...... G06F 1/1616; G06F 1/1618; G06F 1/162; G06F 1/1615; G06F 1/1626; G06F 2200/1633; H05K 5/0017; H05K 5/0226; H05K 5/0086; H05K 5/0247; H05K 5/04; H05K 5/03
See application file for complete search history.

(56) References Cited

U.S. PATENT DOCUMENTS

| | | | | |
|---|---|---|---|---|
| 6,016,952 A | * | 1/2000 | Smith .................. | B65D 5/3614 229/117 |
| 6,149,001 A | * | 11/2000 | Akins .................. | G06F 1/1616 206/320 |

(Continued)

*Primary Examiner* — Adam B Dravininkas
(74) *Attorney, Agent, or Firm* — Workman Nydegger

(57) ABSTRACT

An electronic media case includes an electronic display device powered by a battery that includes a display screen. The electronic media case also includes a display housing that has a first flap and a first plurality of foldable tabs surrounding the electronic display device. A viewing window is cut into the first flap, exposing the display screen through the first flap. The electronic media case also includes a folding case that has a second flap to which the foldable tabs of the first plurality of foldable tabs are connected. The folding case also has a third flap connected to the second flap at a first folding interface. The electronic media case includes a media sleeve that is connected to the third flap.

19 Claims, 6 Drawing Sheets

(51) Int. Cl.
H05K 5/00 (2006.01)
H05K 5/02 (2006.01)

(56) References Cited

U.S. PATENT DOCUMENTS

| | | | | |
|---|---|---|---|---|
| 6,460,279 | B1 * | 10/2002 | Stanley | G09F 3/20 |
| | | | | 40/594 |
| 8,887,902 | B1 * | 11/2014 | Liu | G06F 1/1626 |
| | | | | 206/320 |
| 9,729,685 | B2 * | 8/2017 | Ive | G06F 1/1632 |
| 2008/0135430 | A1 * | 6/2008 | Fitzsimons | G11B 33/045 |
| | | | | 206/308.1 |
| 2010/0084414 | A1 * | 4/2010 | Dehlin | B65D 83/0463 |
| | | | | 220/694 |
| 2011/0036734 | A1 * | 2/2011 | Meador, III | B65D 85/548 |
| | | | | 206/308.1 |
| 2012/0267276 | A1 * | 10/2012 | Hunter | B42D 15/045 |
| | | | | 206/449 |
| 2014/0224676 | A1 * | 8/2014 | Ashley | G06F 1/1635 |
| | | | | 206/37 |
| 2019/0021465 | A1 * | 1/2019 | Diebel | G06F 1/1626 |

* cited by examiner

SYSTEMS AND APPARATUSES FOR AN INTERACTIVE MEDIA PACKAGE

CROSS-REFERENCE TO RELATED APPLICATIONS

This application claims priority to and the benefit of U.S. Provisional Patent Application Ser. No. 62/928,224, filed Oct. 30, 2019 and titled "MEDIA CASE," which is incorporated herein by this reference in its entirety.

BACKGROUND

Media creators and businesses sell optical discs with audio and/or video content stored thereon. Various devices and methods for packaging optical discs have arisen over the years, such as jewel cases, paper or Tyvek sleeves, Q packs, snap cases, lift-lock cases, multi-disc cases, etc.

Media creators and businesses often design the packaging of an optical disc to be thematically intertwined with the media content of the enclosed optical disc. Media creators and businesses, therefore, exercise great care to ensure that the artistic expression of the optical disc packaging is cohesive with the artistic expression of the enclosed optical disc.

Additionally, in some instances, optical disc packaging is considered as important as (or more important than) the optical disc itself. For example, optical disc sellers often utilize unique or different packaging designs to indicate a special edition or version of an enclosed optical disc. Special editions or versions of optical discs are vigorously sought after by enthusiastic consumers, who will often expend great efforts to procure them. Knowing this, many optical disc sellers optimize the packaging of special editions or versions of optical discs for display in a consumer's residence with special artistic expression indicative of the uniqueness of the optical disc.

However, the modes of artistic expression available on optical disc packaging are typically limited to two-dimensional graphics or photographs. Accordingly, improvements can be made to allow for additional modes of artistic expression in optical disc packaging.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Embodiments described herein are directed to media cases, optical media kits, and methods for encasing an optical disc. In one embodiment, a media case includes an electronic display device that includes a battery-powered display screen. The media case additionally includes a display housing that includes a first flap and a first plurality of foldable tabs surrounding the electronic display device. The viewing window is cut into the first flap exposing the battery-powered display screen through the first flap. The media case additionally includes a folding case having a second flap such that the foldable tabs of the first plurality of foldable tabs are connected to the second flap. The folding case additionally includes a third flap connected to the second flap at a first folding interface and a media sleeve connected to the third flap.

In one aspect, the media sleeve includes a fourth flap and a second plurality of foldable tabs connected to the third flap. The folding case can further include a fifth flap connected to the second flap or to the third flap at a second folding interface and an additional sleeve formed at least partially by a sixth flap and a third plurality of foldable tabs connected to the fifth flap. Additionally, or alternatively, at least one foldable tab of the first or second plurality of foldable tabs is adhesively connected to the folding case and/or at least one foldable tab of the first or second plurality of foldable tabs is connected to the folding case by insertion into one or more slits in the folding case. In one embodiment, at least one side of the fourth flap includes an arcuate recess.

In one aspect, the media case includes a switch for selectively activating the electronic display device. The switch can be a magnetic switch system that includes a magnet positioned on the third flap or on a fourth flap of the media case.

In one aspect, at least one foldable tab of the first plurality of foldable tabs includes an opening that exposes a space between the first flap and the second flap when the first plurality of foldable tabs is connected to the second flap. The electronic display device can include a charging port accessible through the space and/or the space can be a storage space housing a cable configured to connect to the battery-powered display screen and to charge the battery that is in electrical communication with the battery-powered display screen.

In one aspect, the electronic display device includes a speaker.

In one aspect, the display housing is integrally formed with the second flap of the folding case at a second folding interface.

In one aspect, the media sleeve is integrally formed with the third flap of the folding case.

In another embodiment, a method for encasing an optical disc includes assembling an electronic media case by cutting a viewing window into a first flap of a display housing that has a first plurality of foldable tabs, arranging the display housing on an electronic display device that has a display screen powered by a battery such that the display screen is visible through the viewing window and the foldable tabs of the first plurality of foldable tabs are folded to surround the electronic display device, and connecting the first plurality of foldable tabs to a second flap of a folding case that has a third flap connected to the second flap at a first folding interface and a media sleeve with a fourth flap connected to the third flap of the folding case by a second plurality of foldable tabs of the media sleeve. The method for encasing an optical disc also includes positioning the optical disc within the media sleeve and folding the third flap over the first folding interface such that the third flap is positioned over the display screen of the electronic display device.

In one aspect, the method includes positioning a magnet on the third flap or the fourth flap and a magnetic switch between the display housing and the second flap such that the magnetic switch is configured to selectively activate the electronic display device when the magnet is displaced from the magnetic switch.

In one aspect, the method includes positioning a charging cable within a storage space between the first flap and the second flap defined by an opening in at least one foldable tab of the first plurality of foldable tabs.

In one aspect, the method includes charging the electronic display device by connecting a charging cable into a charging port of the electronic display device. The charging port is accessible by an opening defined by an opening in at least one foldable tab of the first plurality of foldable tabs.

In one aspect, the method includes connecting a third plurality of foldable tabs of an additional sleeve to a fifth flap connected to the second flap or the third flap at a second folding interface.

In another embodiment, an optical media kit includes an electronic media case that has an electronic display device powered by a battery and including a display screen, a display housing that has a first flap and a first plurality of foldable tabs surrounding the electronic display device (with a viewing window cut into the first flap exposing the display screen of the electronic display device through the first flap) with at least one foldable tab of the first plurality of foldable tabs including an opening that defines a storage space between the first flap and a second flap when the first plurality of foldable tabs is connected to a second flap, a folding case with the second flap to which the first plurality of foldable tabs is connected and a third flap connected to the second flap at a first folding interface and a media sleeve with a fourth flap and a second plurality of foldable tabs connected to the third flap. The optical media kit also includes an optical disc positioned within the media sleeve and a power cable for charging the electronic display device positioned within the storage space.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be apparent to one of ordinary skill in the art from the description or may be learned by the practice of the teachings herein. Features and advantages of embodiments described herein may be realized and obtained by means of the instruments and combinations particularly pointed out in the appended claims. Features of the embodiments described herein will become more fully apparent from the following description and appended claims.

BRIEF DESCRIPTION OF THE DRAWINGS

To further clarify the above and other features of the embodiments described herein, a more particular description will be rendered by reference to the appended drawings. It is appreciated that these drawings depict only examples of the embodiments described herein and are therefore not to be considered limiting of its scope. The embodiments will be described and explained with additional specificity and detail through the use of the accompanying drawings in which.

DETAILED DESCRIPTION

Figure 1:
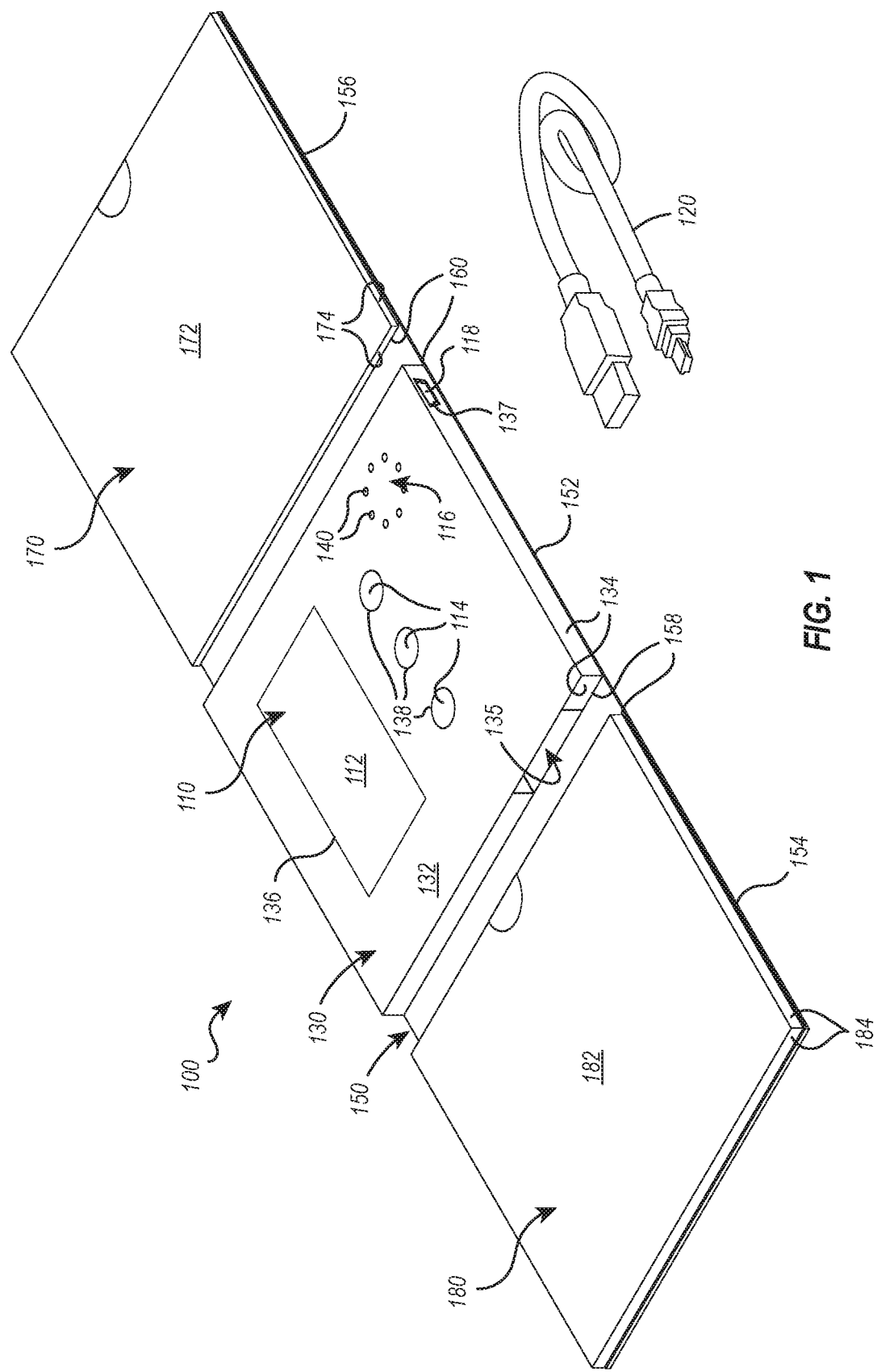
FIG. 1 illustrates a perspective view of an embodiment of an assembled electronic media case in an open configuration, according to the present disclosure.

Optical discs are widely used for distributing audio and/or video content stored thereon. Various devices and methods for packaging optical discs for distribution have arisen, such as jewel cases, paper or Tyvek sleeves, Q packs, snap cases, lift-lock cases, multi-disc cases, etc.

Artists often design the packaging of an optical disc to be thematically intertwined with the media content of the enclosed optical disc. Optical disc sellers, therefore, exercise great care to ensure that the artistic expression of the optical disc packaging is cohesive with the artistic expression of the enclosed optical disc.

Furthermore, optical disc packaging is considered, by some, to be as important as (or more important than) the optical disc itself. For example, optical disc sellers often utilize unique or different packaging designs to indicate a special edition or version of an enclosed optical disc. Special editions or versions of optical discs are vigorously sought after by enthusiastic consumers, who will often expend great efforts to procure them. Knowing this, many optical disc sellers optimize the packaging of special editions or versions of optical discs for display in a collector's residence with special artistic expression indicative of the uniqueness of the optical disc.

However, conventional apparatuses for packaging optical discs may limit the modes of artistic expression available to artists that design the optical disc packaging. For example, artists are typically limited to using two-dimensional graphics or photographs in optical disc packaging, which limits the creative expression available for creating artistic packaging content that complements the artistic content stored on the enclosed optical disc.

Embodiments described herein are directed to electronic media cases, optical media kits, and methods for encasing an optical disc. An electronic media case includes, for example, an electronic display device powered by a battery that includes a display screen. The electronic media case also includes a display housing that has a first flap and a first plurality of foldable tabs surrounding the electronic display device. A viewing window is cut into the first flap, exposing the display screen of the electronic display device through the first flap. The electronic media case also includes a folding case that has a second flap to which the foldable tabs of the first plurality of foldable tabs are connected. The folding case also has a third flap connected to the second flap at a first folding interface. Also, the electronic media case includes a media sleeve that is connected to the third flap of the folding case.

In some implementations, the electronic display device of the electronic media case includes a speaker and a charging port for re-charging the battery of the electronic display device, and the electronic media case includes a storage space that houses a charging cable for charging the electronic display device. Furthermore, in some implementations, the electronic media case includes an additional sleeve for housing additional content related to the enclosed optical disc and/or artists associated with the enclosed optical disc. Additionally, the folding case may include a fifth flap connected to the second flap at a second fold, and a third plurality of foldable tabs of an additional sleeve may be connected to the fifth flap.

Those skilled in the art will recognize that at least some embodiments disclosed herein may address some of the shortcomings of conventional packaging materials for optical discs. For example, an electronic media case of the present disclosure may provide artists with additional modes of expression (e.g., audiovisual expression) for designing optical disc packaging that complements the content of the enclosed optical disc. Furthermore, an electronic media case of the present disclosure may allow artists to create optical disc packaging that is optimized for display and/or interaction by consumers, collectors, and/or enthusiasts (e.g., for special editions/versions of enclosed optical discs).

Having just described some of the various high-level features and benefits of the disclosed embodiments, attention will now be directed to FIGS. 1-7. These figures illustrate various functionalities, examples, and supporting illustrations related to electronic media cases, optical media kits, and methods for encasing an optical disc.

FIG. 1 illustrates a perspective view of an embodiment of an assembled electronic media case 100 in an open configuration, according to the present disclosure. As shown, the electronic media case 100 includes an electronic display device 110 powered by a battery. The electronic display device 110 has a display screen 112, a speaker 116, a charging port 118, and buttons 114 for controlling the electronic display device 110 (e.g., for pausing display of a video, increasing or decreasing volume, selecting a video for display). The display screen 112 may be any type of electronic display screen, such as a liquid crystal display (LCD), a light-emitting diode (LED) display, an organic LED (OLED) display or any other display means that is capable of displaying images or videos. In some instances, the electronic display device is configured to display content (e.g., images, videos, sounds) designed to complement the content of an optical disc associated with the electronic media case 100.

It will be appreciated that an electronic display device 110 may implement a computing system. The term "computing system" includes any device, system, or combination thereof that includes at least one processor or microprocessor and a physical and tangible computer-readable memory capable of having thereon computer-executable instructions that are executable by the processor. The microprocessor may include embedded code which is configured to execute upon triggering by a sensor, switch, button (e.g., on of the buttons 114) or another trigger. The microprocessor may, for example, execute code that processes and displays a video or stationary image that is displayed in the electronic display.

As broadly defined herein, a computing system may include at least one processing unit and memory. The memory may be physical memory, which may be volatile, non-volatile, or some combination of the two. The memory and the microprocessor may be powered by a battery that is embedded in or otherwise attached to the computing system. The code executed by the microprocessor may be referred to as an "executable module" or "executable component," and can refer to software objects, routines, methods, or similar computer-executable instructions that may be executed on the computing system. For example, different videos and/or images may be displayed on the electronic display based on which switch(es) has/have been triggered and/or which buttons have been pushed on the electronic marketing apparatus.

In some cases, a computing system may also contain communication channels that allow the computing system to communicate with other message processors over a wired or wireless network. Such communication channels may include hardware-based receivers, transmitters, or transceivers, which are configured to receive data, transmit data, or perform both. For example, communication channels may include radio frequency identifier (RFID), Bluetooth, WiFi, or global positioning system (GPS) radios or other transceivers, with data ports such as universal serial bus (USB) ports or with other electronic components.

In other cases, the computing system includes no communication channels such that the computing system is not reconfigurable by an ordinary end user to display different content than the content initially stored on the computing system.

Referring again to FIG. 1, the electronic display device 110 is enclosed within a display housing 130 that includes a flap 132 and several tabs 134. The flap 132 has a viewing window 136 cut therein so as to expose the display screen 112 of the electronic display device 110. The flap 132 also has other openings, such as openings 138 for exposing buttons 114 and openings 140 for at least partially exposing the speaker 116. Furthermore, the tabs 134 of the display housing 130 include an opening 137 for accessing the charging port 118 and an opening 135 that defines a storage space between the flap 132 of the display housing 130 and a center flap 152 of a folding case 150 when the tabs 134 are connected to the center flap 152 of the folding case 150. In some instances, the storage space is sized to hold a charging cable 120 for charging the electronic display device 110 through the charging port 118.

The display housing 130 is arranged over the electronic display device 110 and the tabs 134 of the display housing 130 are connected to the center flap 152 of the folding case 150 such that the electronic display device 110 is surrounded by the flap 132 and tabs 134 of the display housing and the center flap 152 of the folding case 150. The tabs 134 are sized to ensure that there is sufficient space between the flap 132 of the display housing 130 and the center flap 152 of the folding case 150 to properly house and secure the electronic display device 110 when the tabs 132 are secured to the center flap 152.

In the embodiment shown, the folding case 150 also includes a right flap 156 connected to the center flap 152 at a first folding interface 160 and a left flap 154 connected to the center flap 152 at a second folding interface 158. A media sleeve 170 is connected to the right flap 156 of the folding case 150, and the media sleeve 170 includes a flap 172 and several tabs 174 that are connected to the right flap 156. In some instances, the media sleeve 170 is sized for holding an optical disc, such as a compact disc, minidisc, magneto optical disc, digital versatile disc, laser intensity modulation direct overwrite, GD-ROM, ultra-density optical, FVD, Blu-ray disc, professional disc, multiplexed optical data storage, holographic versatile disc, protein-coated disc, archival disc, ultra HD Blu-ray, etc.

Similarly, in some instances, an additional sleeve 180 is connected to the left flap 154 of the folding case 150, and the additional sleeve 180 includes a flap 182 and several tabs 184 that are connected to the left flap 154. In some cases, the additional sleeve is sized to hold additional content related to the enclosed optical disc, such as printed media (e.g., listings of content, lyrics, promotional material).

It will be appreciated that the electronic media case layout, arrangement, and/or form factor depicted in the embodiments shown in FIG. 1 and other figures described herein are exemplary only and non-limiting. For example, an electronic display element of a media case could be positioned on a right flap or left flap of a folding case, a media sleeve could be positioned on a center flap or left flap of a folding case, and an additional sleeve may be positioned on a center flap or right flap of a folding case.

Furthermore, an electronic media case of the present disclosure may include fewer or more elements than those explicitly shown in FIGS. 1-6. For example, in some instances, a folding case of an electronic media case only includes two flaps joined at a single folding interface (one holding an electronic display device and the other holding a media sleeve), and the electronic media case omits an additional sleeve (or has an additional sleeve positioned on the same flap as the media sleeve but on an opposing side). In other instances, an electronic media case includes more than one media sleeve (e.g., two media sleeves, rather than a media sleeve and an additional sleeve). For example, a folding case may include five flaps (e.g., a center, top, right, left, and bottom flap joined at various folding interfaces) to accommodate an electronic display device and four media sleeves for housing four or more optical discs.

Additionally, it should be noted that a media sleeve need not include a flap and a set of tabs, but can be embodied as any mechanism for securing an optical disc, such as a protrusion for gripping an optical disc by a hole in the optical disc.

Figure 2:
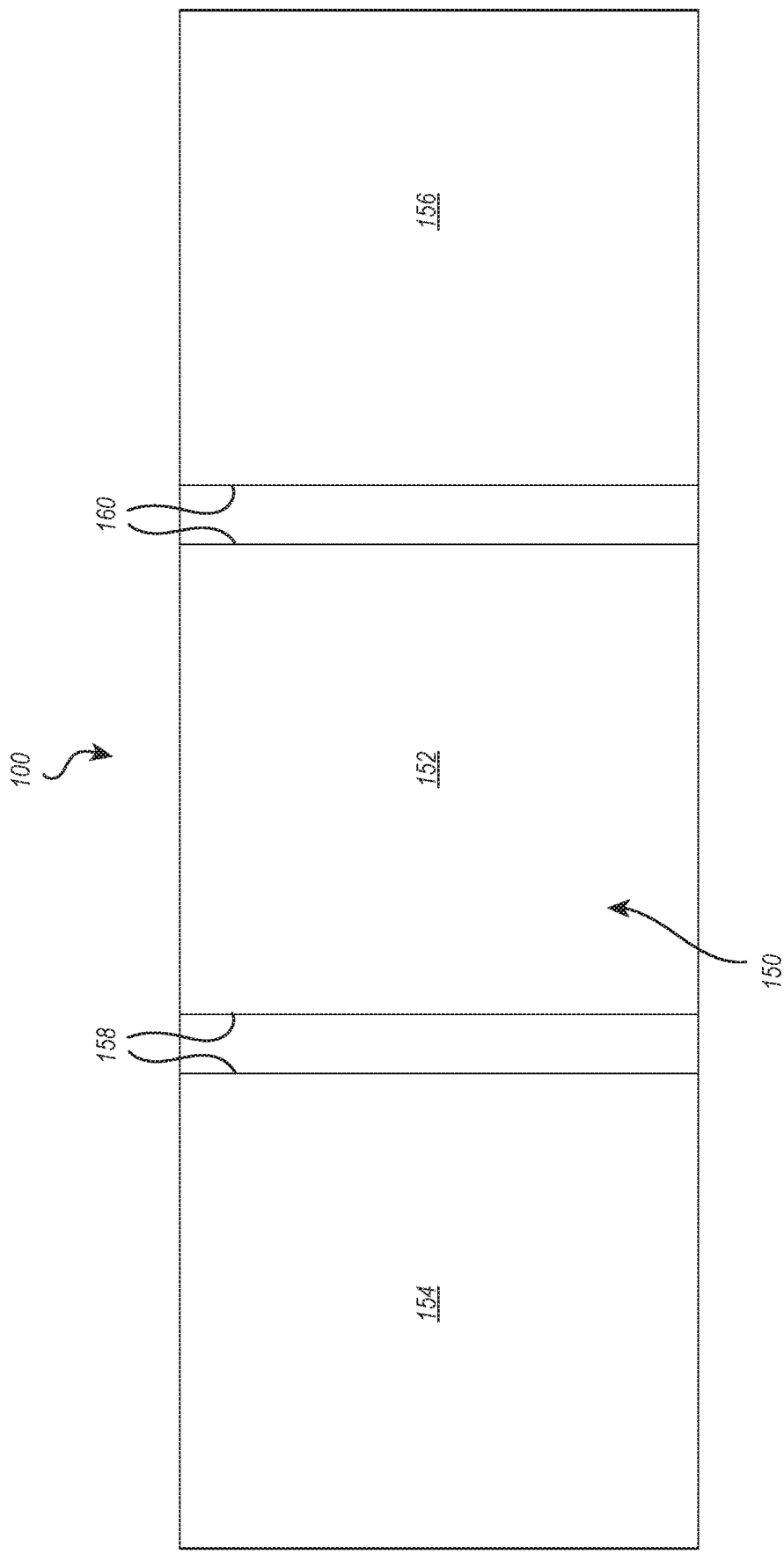
FIG. 2 illustrates a rear view of an embodiment of an assembled electronic media case in an open configuration, according to the present disclosure.

FIG. 2 illustrates a rear view of an embodiment of an assembled electronic media case 100 in an open configuration, according to the present disclosure. Those skilled in the art will appreciate that the folding case 150 of the electronic media case 100 may include additional graphics/artwork (e.g., a design or logo) on the various flaps (e.g., left flap 154, center flap 152, and/or right flap 156) or folding interfaces (e.g., first and second folding interfaces 160, 158) thereof designed to complement the contents of the enclosed optical media.

Figure 3:
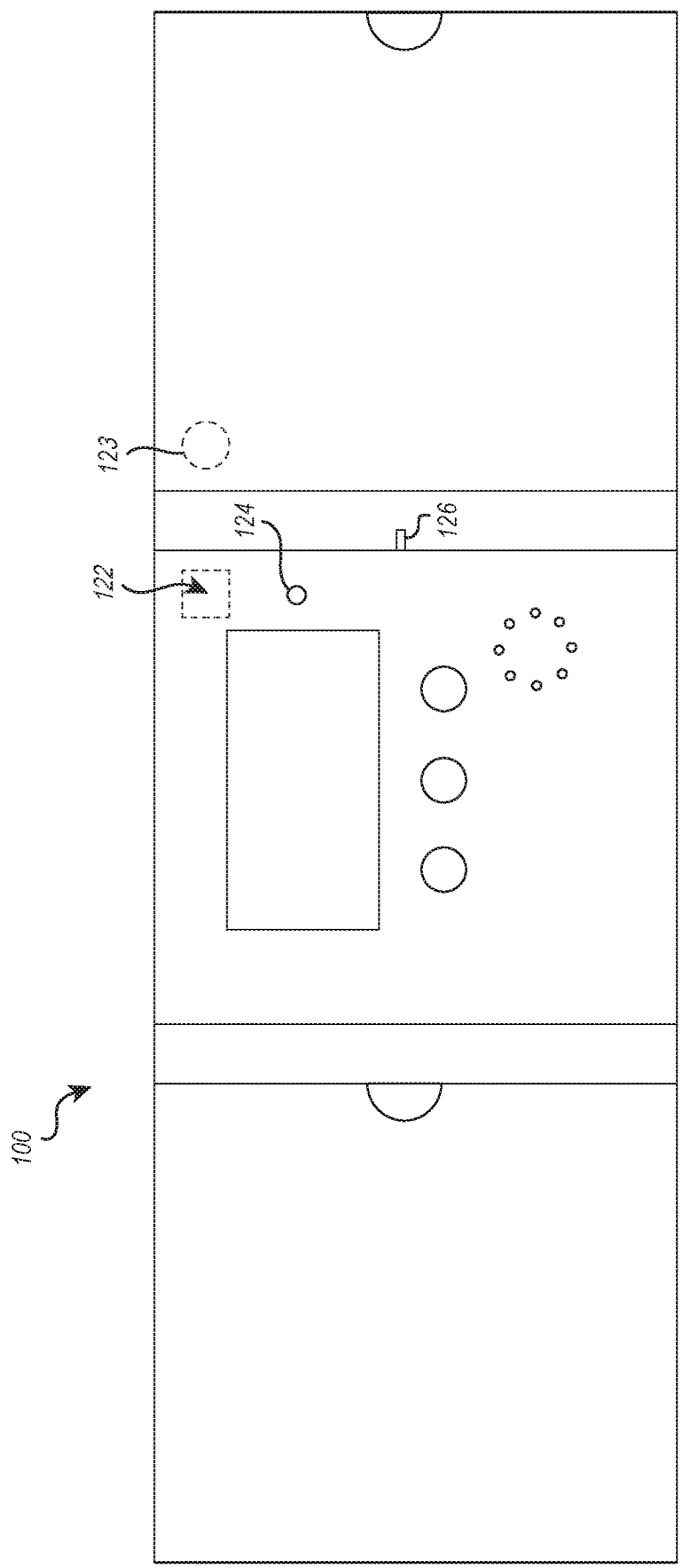
FIG. 3 illustrates a front view of an embodiment of an assembled electronic media case in an open configuration with examples of a switch, according to the present disclosure.

FIG. 3 illustrates a front view of an embodiment of an assembled electronic media case 100 in an open configuration with examples of a switch, according to the present disclosure. For simplicity, other elements described with reference to FIGS. 1 and 2 are omitted in FIG. 3. In some embodiments, an electronic media case 100 includes a switch for selectively activating the electronic display device to display an image or video stored on the electronic display device. In some instances, the switch is configured to activate the electronic display device when a user changes at least a portion of the electronic media case from a closed position to an open position. For example, a switch may be embodied as a magnetic switch system comprising a magnetic sensor positioned on or within the display housing and a magnet 123 positioned proximate to the right flap of the folding case (or vice versa). In the embodiment shown, when the electronic media case 100 is in a closed position (e.g., the right flap of the folding case is folded over the display housing, as shown in more detail with reference to FIGS. 5 and 6), the magnet 123 is in close proximity to the magnetic sensor 122, which causes the electronic display device to persist in an inactive state (e.g., the magnetic sensor 122 opens a circuit of the electronic display device upon sensing the magnet 123 in close proximity). When the electronic media case 100 is in an open position (as shown in FIG. 3), the magnet 123 is displaced from the magnetic sensor 122, which causes the electronic display device to enter an active state (e.g., the magnetic sensor 122 closes a circuit of the electronic display device upon sensing that the magnet 123 is not in close proximity).

In other embodiments, an electronic media case 100 includes one or more electromechanical switches 124 and/or 126 which are operable to selectively deactivate the electronic display device when the electronic media case 100 is in a closed configuration and to selectively activate/enable the electronic display device when the electronic media case 100 is in an open configuration. For example, a folding interface or flap of the media sleeve may press an electromechanical switch 124 and/or 126 to open a circuit of the electronic display device when the folding interface or flap is folded to abut the display housing.

It should be noted that the positioning and form of the switches shown in FIG. 3 are exemplary only and non-limiting. For example, a magnetic switch may be positioned to operate based on the movement of the left flap rather than the right flap, and other switches/sensors may be utilized to selectively active and/or deactivate the electronic display device, such as piezoelectric switches, photoelectric switches, inductive sensors, capacitive sensors, resistive sensors, etc.

Those skilled in the art will appreciate that the selective activation and/or deactivation of an electronic display device of an electronic media case 100 need not be depend on whether the electronic media case 100 is in an open or closed configuration. For example, an electronic media case 100 may include an electromechanical switch positioned so as to be accessible to users whether the electronic media case 100 is in an open configuration or a closed configuration (e.g., extending from a top or bottom foldable tab of the display housing).

Figure 4:
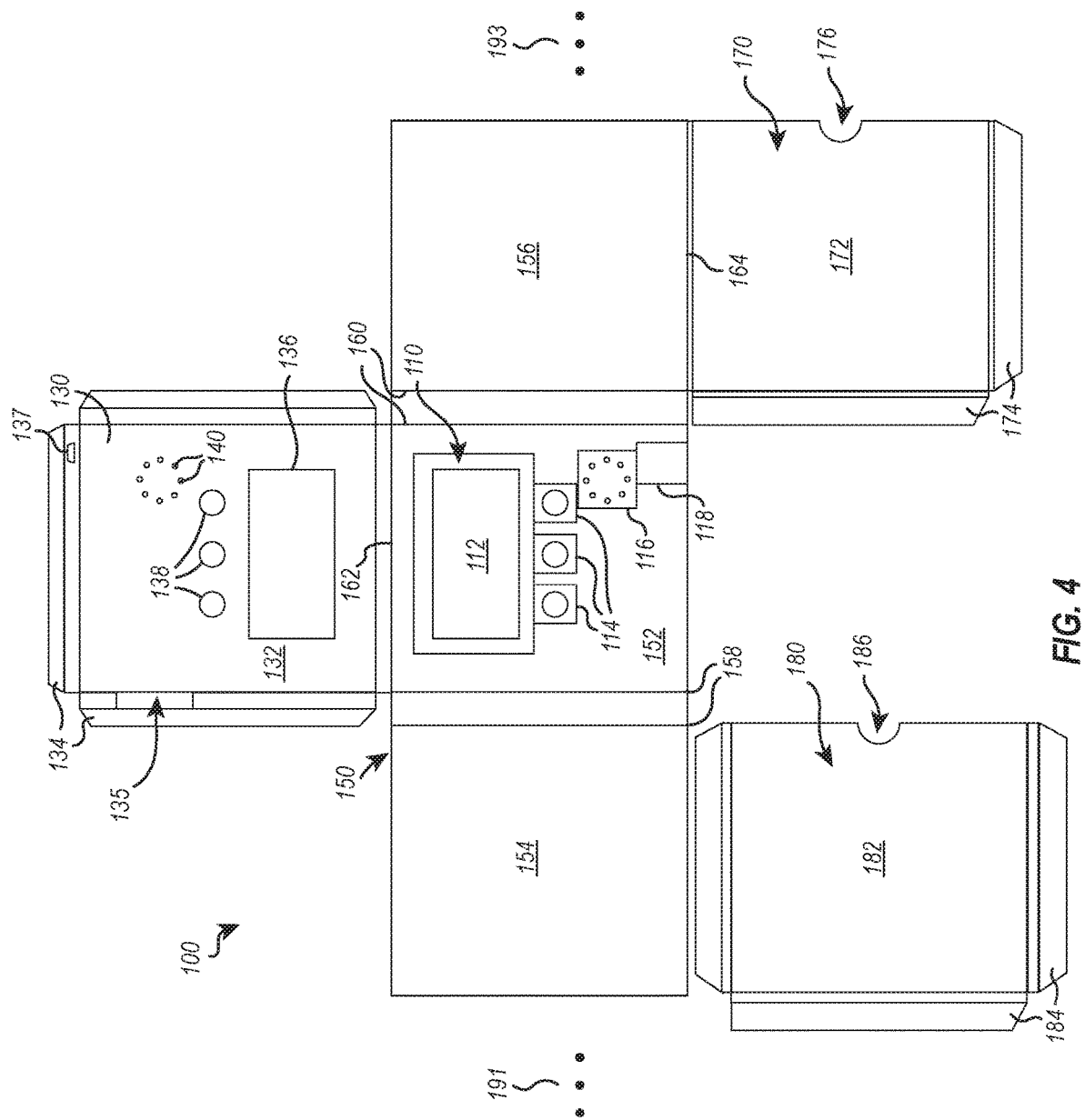
FIG. 4 illustrates a front view of an example embodiment of an unassembled electronic media case in an open configuration, according to the present disclosure.

FIG. 4 illustrates a front view of an example embodiment of an unassembled electronic media case 100 in an open configuration, according to the present disclosure. In the embodiment shown, the display housing 130 is integrally formed with the folding case at a folding interface 162 and the media sleeve 170 is integrally formed with the folding case at a folding interface. To assemble the electronic media case shown in FIG. 4, an assembler folds the display housing 130 over the appropriate folding interface 162 and connects the tabs 134 to the center flap of the folding case 150 such that the flap 132 of the display housing 130 is disposed over the electronic display device 110 with the display screen 112 of the visible through the viewing window 136, the buttons 114 accessible through the button openings 138, the speaker at least partially exposed through the speaker openings 140, a storage space between the flap 132 of the display housing 130 and the center flap 152 accessible through the opening of the storage space 135, and the charging port 118 accessible through the charging port opening 137.

An assembler may also fold the flap 172 of the media sleeve 170 over the folding interface 164 and connects the tabs 174 of the media sleeve to the right flap 156 of the folding case 150 to form a space for securing optical media that is accessible from a side of the electronic media case 100 when the electronic media case 100 is in an open configuration. In some instances, the flap 172 of the media sleeve 170 includes a recessed portion 176 for facilitating ease of access to the contents of the media sleeve 170.

Furthermore, in the embodiment shown, the additional sleeve 180 is manufactured as a part that is separate from the folding case 150, the display housing 130, and the media sleeve 170. Accordingly, an assembler affixes the tabs 184 of the additional sleeve to the left flap 154 of the folding case to form a space for securing additional materials/media that is accessible from a side of the electronic media case when the electronic media case is in an open configuration. In some instances, the flap 182 of the additional sleeve 180 includes a recessed portion 186 for facilitating ease of access to the contents of the additional sleeve 180.

In some embodiments, the foldable tabs of the various flaps (e.g., the flap 132 of the display housing, the flap 172 of the media sleeve 170, the flap 182 of the additional sleeve 180) are connected to the folding case 150 by an adhesive. In other instances, the tabs are connected to the folding case 150 by inserting the tabs into slits formed in the folding case 150 sized to receive the tabs. Other connection means or mechanisms may also be utilized to connect the tabs to the folding case 150.

Those skilled in the art will recognize that various parts of the electronic media case 100 (e.g., the display housing 130, the media sleeve 170, the additional sleeve 180) may be manufactured to be integrally formed with the folding case 150 or as separate pieces. For example, in some instances, the display housing 130, the media sleeve 170, and the additional sleeve 180 are all formed as pieces separate from the folding case 150. In other instances, the display housing 130 and the additional sleeve 180 are integrally formed with the folding case 150, while the media sleeve 170 is formed as a separate piece. In yet other instances, the media sleeve 170 and the additional sleeve 180 are integrally formed with the folding case 150, while the display housing 130 is formed as a separate piece. In still other instances, only one of the display housing 130, the media sleeve 170, or the additional sleeve 180 is integrally formed with the folding case.

It will also be appreciated that the particular arrangement of the display housing 130, the media sleeve 170, and/or the additional sleeve 180 with respect to the folding case is exemplary only and non-limiting. For example, the display housing 130 could be formed to fold upward over the center flap 152, rather than downward as shown, or the media sleeve 170 could be formed to fold leftward over the right flap 156, rather than upward as shown. Additionally, ellipses 191 and 193 indicate that the folding case/display housing 130 may include additional folding members separate from those shown in FIG. 4, such as folding members for preserving a desirable edge aesthetic along the edges of the electronic media case 100, or flaps to receive additional sleeves, display housings, and/or media sleeves.

Also, it will be recognized that other orientations of the openings of the media sleeve 170 and/or the additional sleeve 180 are within the scope of this disclosure (e.g., the media sleeve 170 could open inward toward the electronic display device 110).

It should be noted that although contents of the media sleeve and/or the additional sleeve are depicted in FIG. 4 to only be accessible when the electronic media case 100 is in an open configuration, other embodiments include configurations in which the contents of the media sleeve and/or the additional sleeve are accessible when the electronic media case is in a closed configuration.

Figure 5:
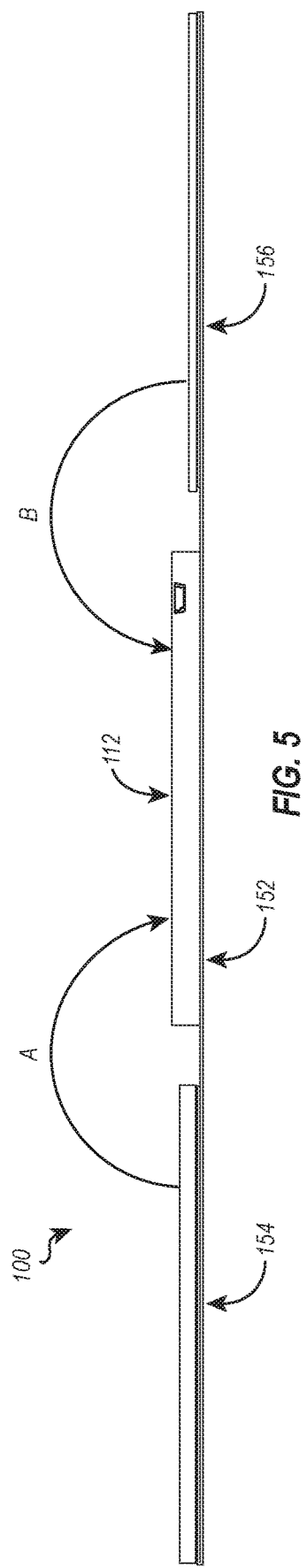
FIG. 5 illustrates a side view of an embodiment of an assembled electronic media case in an open configuration, according to the present disclosure.
Figure 6:
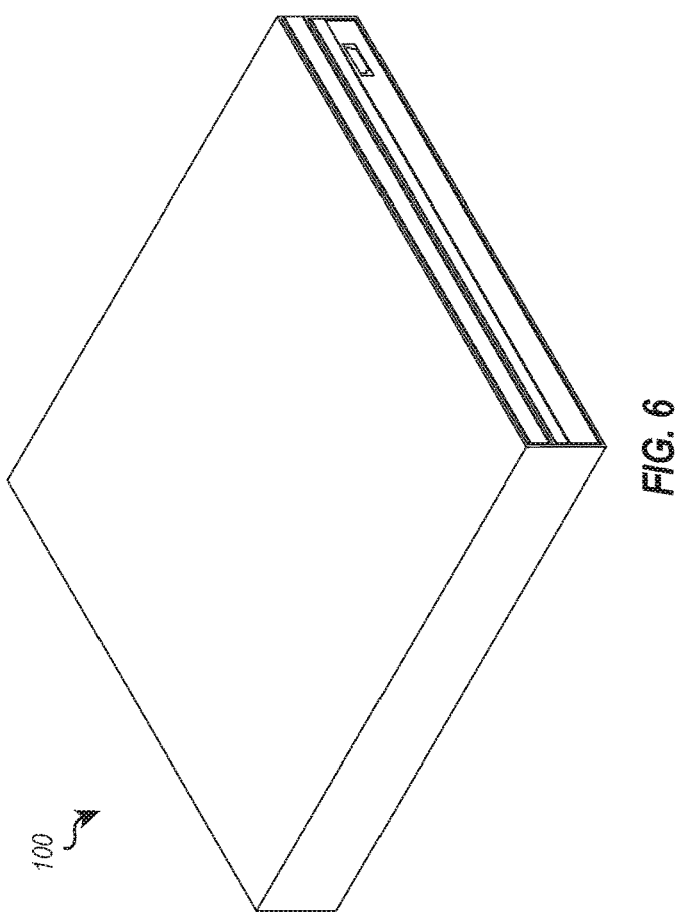
FIG. 6 illustrates a perspective view of an embodiment of an assembled electronic media case in a closed configuration, according to the present disclosure.

FIG. 5 illustrates a side view of an embodiment of an assembled electronic media case 100 in an open configuration, according to the present disclosure. Arrows A and B indicate steps that may be taken to change the electronic media case 100 from an open configuration (as shown in FIG. 5) to a closed configuration (as shown in FIG. 6). In particular, arrow B conceptually represents a step of folding the right flap 156 of the folding case 150 and the media sleeve 170 over the folding interface 160 such that the media sleeve 170 is disposed over and abuts the display housing 130 and the display screen 112 of the electronic display device 110. In some instances, folding in accordance with arrow B operates a switch (e.g., as shown and described with reference to FIG. 3) to selectively deactivate the electronic display device 110.

Arrow A conceptually represents a step of folding the left flap 154 of the folding case and the additional sleeve 180 over the folding interface 158 such that the additional sleeve 180 is disposed over and abuts the right flap 156 of the folding case. Performing the steps conceptually represented by arrows A and B, closes the electronic media case 100, as represented in FIG. 6. In this closed configuration, the right flap 156, the media sleeve 170, the left flap 154, and the additional sleeve 180 are positioned over the display screen 112 of the electronic display device 110. It should be noted that other orderings/configurations for folding portions of the electronic media case 100 over the display screen 112 are within the scope of this disclosure (e.g., the additional sleeve may be folded first, or an additional sleeve may be omitted such that only a single folding action occurs to close the electronic media case).

It will be appreciated that the electronic media case 100 of the present disclosure may, in some instances, be distributed and/or sold to consumers as a kit in the closed configuration shown in FIG. 6. An optical media kit may include an electronic media case 100 as described herein, an optical disc positioned within the media sleeve 170 of the electronic media case 100, and a power cable 120 for charging the electronic display device 110 of the electronic media case 100. In some instances, the power cable 120 is disposed within a storage space 135 of the electronic media case 100 upon distribution to a consumer.

The following discussion now refers to a number of methods and method acts that may be performed.

Figure 7:
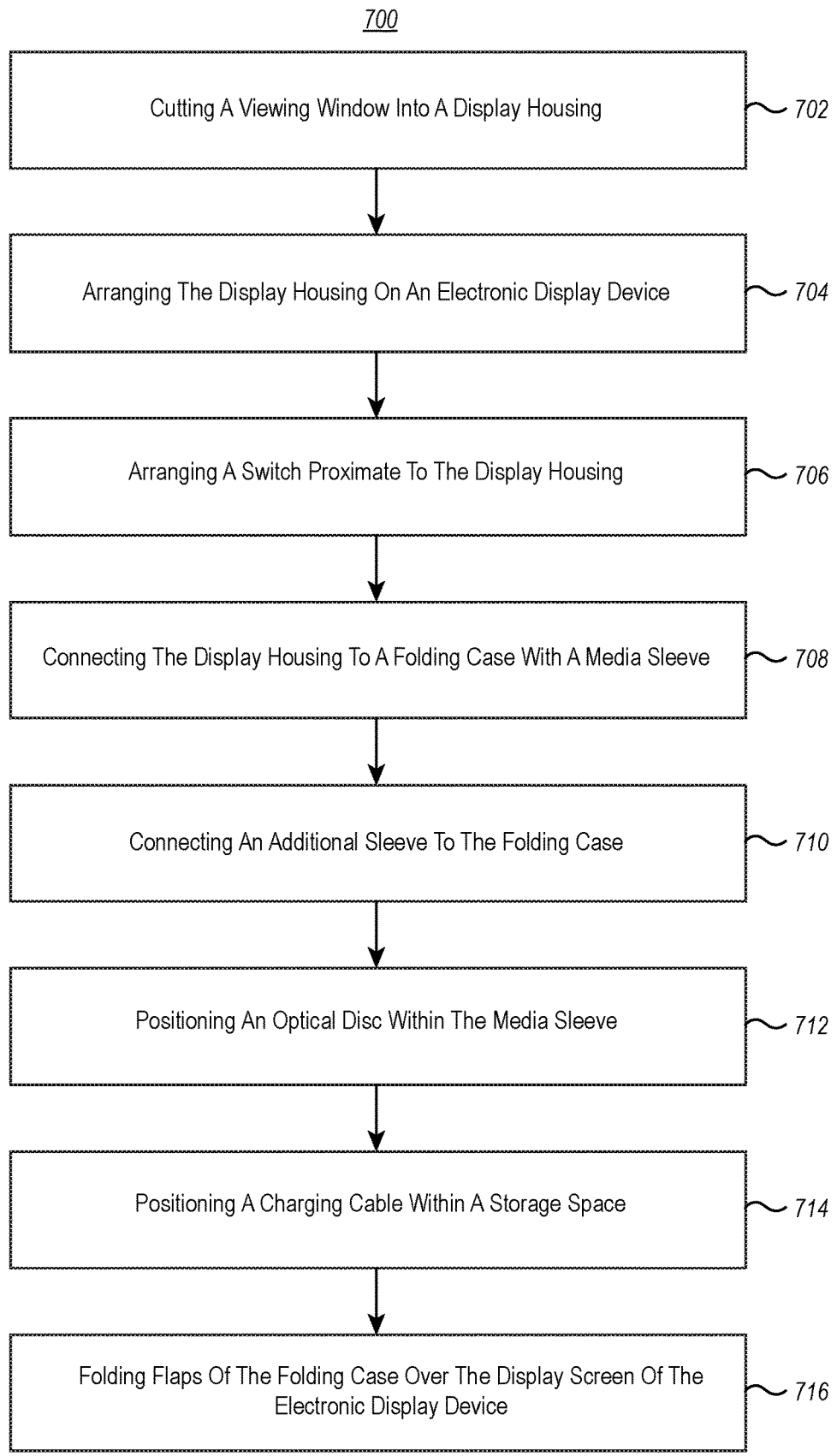
FIG. 7 illustrates an exemplary flow diagram depicting a method for encasing an optical disc, according to the present disclosure.

FIG. 7 illustrates an exemplary flow diagram 700 depicting a method for encasing an optical disc, according to the present disclosure. Although the steps shown in the flow diagram may be illustrated or discussed in a certain order, no particular ordering is required unless specifically stated, or required because an act is dependent on another act being completed prior to the act being performed. Flow diagram 700 illustrates acts of cutting a viewing window into a display housing (act 702), arranging the display housing on an electronic display device (act 704), arranging a switch proximate to the display housing (act 706), connecting the display housing to a folding case with a media sleeve (act 708), connecting an additional sleeve to the folding case (act 710), positioning an optical disc within the media sleeve (act 712), positioning a charging cable within a storage space (act 714), and folding flaps of the folding case over the display screen of the electronic display device (act 716).

As noted above, act 702 includes cutting a viewing window into a display housing. In some instances, the viewing window is cut into a flap of a display housing, and the display housing further includes a plurality of foldable tabs. The viewing window may be sized and shaped to at least partially expose a display screen of an electronic display device when the display housing is positioned on/around the electronic display device.

Act 704 includes arranging the display housing on an electronic display device. In some instances, the electronic display device includes a display screen that is powered by a battery. When the display housing is arranged on the display screen of the electronic display device, the display screen may be visible through the viewing window of the display housing, and the foldable tabs of the display housing are folded to surround the electronic display device.

Act 706 includes arranging a switch proximate to the display housing. In some implementations, an electromechanical switch is utilized. In other instances, a magnetic or other switch is used, such as by positioning a magnetic sensor proximate to or within the display housing and positioning a magnet to another part of the electronic media case such that folding a part of the electronic media case displaces the magnet to cause the magnetic sensor to switch from an on position to an off position and vice versa. In some embodiments, the switch is configured to selectively activate/deactivate the electronic display device.

Act 708 includes connecting the display housing to a folding case with a media sleeve. In some instances, the foldable tabs of the display housing are connected to a flap of the folding case (e.g., by adhesive) and the media sleeve is connected to another flap of the folding case by connecting a set of foldable tabs of the media sleeve to the other flap of the folding case.

Act 710 includes connecting an additional sleeve to the folding case. In some implementations, the additional sleeve includes yet another set of foldable tabs that are connected to yet another flap of the folding case (e.g., by adhesive).

Act 712 includes positioning an optical disc within the media sleeve. The optical disc may take the form of any optical media, such as a compact disc, minidisc, magneto optical disc, digital versatile disc, laser intensity modulation direct overwrite, GD-ROM, ultra-density optical, FVD, Blu-ray disc, professional disc, multiplexed optical data storage, holographic versatile disc, protein-coated disc, archival disc, ultra HD Blu-ray, etc.

Act 714 includes positioning a charging cable within a storage space. In some instances, the storage space is defined by an opening in at least one of the foldable tabs of the display housing and extends between the display housing and a flap of the folding case to which the display housing is connected.

Act 716 includes folding flaps of the folding case over the display screen of the electronic display device. In some instances, one flap to which the media sleeve is connected becomes folded over the display screen of the electronic display device, and another flap to which the additional sleeve is connected becomes folded over the back of the media sleeve and the flap to which the media sleeve is connected.

The concepts and features described herein may be embodied in other specific forms without departing from their spirit or descriptive characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

We claim:

1. A media case, comprising:
   an electronic display device comprising a battery-powered display screen;
   a display housing comprising a first flap and a first plurality of foldable tabs surrounding the electronic display device, wherein a viewing window is cut into the first flap exposing the battery-powered display screen through the first flap;
   a folding case comprising a second flap, the foldable tabs of the first plurality of foldable tabs being connected to the second flap, the folding case further comprising a third flap connected to the second flap at a first folding interface; and
   a media sleeve connected to the third flap wherein the media sleeve comprises a fourth flap and a second plurality of foldable tabs connected to the third flap.

2. The media case of claim 1, wherein the folding case further comprises a fifth flap connected to the second flap or to the third flap at a second folding interface, and wherein the electronic media case further comprises an additional sleeve formed at least partially by a sixth flap and a third plurality of foldable tabs connected to the fifth flap.

3. The media case of claim 1, wherein at least one foldable tab of the first or second plurality of foldable tabs is adhesively connected to the folding case.

4. The media case of claim 1, wherein at least one foldable tab of the first or second plurality of foldable tabs is connected to the folding case by insertion into one or more slits in the folding case.

5. The media case of claim 1, wherein at least one side of the fourth flap includes an arcuate recess.

6. The media case of claim 1, further comprising a switch for selectively activating the electronic display device.

7. The media case of claim 6, wherein the media sleeve comprises a fourth flap, and wherein the switch is a magnetic switch system comprising a magnet positioned on the third flap or the fourth flap.

8. The media case of claim 1, wherein at least one foldable tab of the first plurality of foldable tabs includes an opening that exposes a space between the first flap and the second flap when the first plurality of foldable tabs is connected to the second flap.

9. The media case of claim 8, wherein the electronic display device comprises a charging port accessible through the space.

10. The media case of claim 9, wherein the space is a storage space comprising a cable connected to the battery-powered display screen and operable to charge a battery in electrical communication with the battery-powered display screen.

11. The media case of claim 1, wherein the electronic display device comprises a speaker.

12. The media case of claim 1, wherein the display housing is integrally formed with the second flap of the folding case at a second folding interface.

13. The media case of claim 1, wherein the media sleeve is integrally formed with the third flap of the folding case.

14. A method for encasing an optical disc, comprising:
    assembling an electronic media case by:
    cutting a viewing window into a first flap of a display housing comprising a first plurality of foldable tabs;
    arranging the display housing on an electronic display device comprising a display screen powered by a battery such that the display screen is visible through the viewing window and the foldable tabs of the first plurality of foldable tabs are folded to surround the electronic display device; and
    connecting the first plurality of foldable tabs to a second flap of a folding case comprising a third flap connected to the second flap at a first folding interface and a media sleeve comprising a fourth flap and connected to the third flap of the folding case by a second plurality of foldable tabs of the media sleeve;
    positioning the optical disc within the media sleeve; and
    folding the third flap over the first folding interface such that the third flap is positioned over the display screen of the electronic display device.

15. The method for encasing an optical disc of claim 14, further comprising positioning a magnet on the third flap or the fourth flap and a magnetic switch between the display housing and the second flap, the magnetic switch being configured to selectively activate the electronic display device when the magnet is displaced from the magnetic switch.

16. The method for encasing an optical disc of claim 14, further comprising positioning a charging cable within a storage space between the first flap and the second flap defined by an opening in at least one foldable tab of the first plurality of foldable tabs.

17. The method for encasing an optical disc of claim 14, further comprising charging the electronic display device by connecting a charging cable into a charging port of the electronic display device, the charging port being accessible by an opening defined by an opening in at least one foldable tab of the first plurality of foldable tabs.

18. The method for encasing an optical disc of claim 14, further comprising connecting a third plurality of foldable tabs of an additional sleeve to a fifth flap connected to the second flap or the third flap at a second folding interface.

19. An optical media kit comprising:
a media case comprising:
an electronic display device comprising a display screen powered by a battery;
a display housing comprising a first flap and a first plurality of foldable tabs surrounding the electronic display device, wherein a viewing window is cut into the first flap exposing the display screen of the electronic display device through the first flap and wherein at least one foldable tab of the first plurality of foldable tabs includes an opening that defines a storage space between the first flap and a second flap when the first plurality of foldable tabs is connected to a second flap;
a folding case comprising the second flap, the foldable tabs of the first plurality of foldable tabs being connected to the second flap, the folding case further comprising a third flap connected to the second flap at a first folding interface; and
a media sleeve comprising a fourth flap and a second plurality of foldable tabs, the second plurality of foldable tabs being connected to the third flap;
an optical disc positioned within the media sleeve; and
a power cable for charging the electronic display device positioned within the storage space.

* * * * *